(12) United States Patent
Cui et al.

(10) Patent No.: US 11,488,835 B2
(45) Date of Patent: Nov. 1, 2022

(54) SYSTEMS AND METHODS FOR TUNGSTEN-CONTAINING FILM REMOVAL

(71) Applicant: Applied Materials, Inc., Santa Clara, CA (US)

(72) Inventors: Zhenjiang Cui, San Jose, CA (US); Rohan Puligoru Reddy, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/100,141

(22) Filed: Nov. 20, 2020

(65) Prior Publication Data

US 2022/0165580 A1    May 26, 2022

(51) Int. Cl.
| | |
|---|---|
| *H01L 21/3213* | (2006.01) |
| *H01L 21/67* | (2006.01) |
| *H01L 21/02* | (2006.01) |
| *H01L 21/3065* | (2006.01) |

(52) U.S. Cl.
CPC .. *H01L 21/32136* (2013.01); *H01L 21/02614* (2013.01); *H01L 21/3065* (2013.01); *H01L 21/30655* (2013.01); *H01L 21/6708* (2013.01)

(58) Field of Classification Search
None
See application file for complete search history.

(56) References Cited

U.S. PATENT DOCUMENTS

| | | | |
|---|---|---|---|
| 6,461,974 B1 | 10/2002 | Ni et al. | |
| 9,064,815 B2* | 6/2015 | Zhang | C23F 4/00 |
| 9,472,417 B2 | 10/2016 | Ingle et al. | |
| 2014/0199850 A1* | 7/2014 | Kim | H01J 37/32357 |
| | | | 438/722 |
| 2015/0311089 A1 | 10/2015 | Kim et al. | |
| 2018/0047577 A1* | 2/2018 | Clark | H01L 21/31122 |
| 2018/0166255 A1 | 6/2018 | Blomberg et al. | |

FOREIGN PATENT DOCUMENTS

JP        2015-191922 A       11/2015

OTHER PUBLICATIONS

International Search Report and Written Opinion dated Mar. 3, 2022 in International Patent Application No. PCT/US2021/059712, 7 pages.

* cited by examiner

*Primary Examiner* — Stephanie P Duclair
(74) *Attorney, Agent, or Firm* — Kilpatrick Townsend & Stockton LLP

(57) ABSTRACT

Exemplary etching methods may include flowing a halogen-containing precursor into a remote plasma region of a semiconductor processing chamber while striking a plasma to produce plasma effluents. The methods may include contacting a substrate housed in a processing region with the plasma effluents. The substrate may define an exposed region of tungsten oxide. The contacting may produce a tungsten oxy-fluoride material. The methods may include flowing an etchant precursor into the processing region. The methods may include contacting the tungsten oxy-fluoride material with the etchant precursor. The methods may include removing the tungsten oxy-fluoride material.

20 Claims, 5 Drawing Sheets

SYSTEMS AND METHODS FOR TUNGSTEN-CONTAINING FILM REMOVAL

TECHNICAL FIELD

The present technology relates to semiconductor processes and equipment. More specifically, the present technology relates to selectively etching tungsten-containing structures.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Exemplary etching methods may include flowing a halogen-containing precursor into a remote plasma region of a semiconductor processing chamber while striking a plasma to produce plasma effluents. The methods may include contacting a substrate housed in a processing region with the plasma effluents. The substrate may define an exposed region of tungsten oxide. The contacting may produce a tungsten oxy-fluoride material. The methods may include flowing an etchant precursor into the processing region. The methods may include contacting the tungsten oxy-fluoride material with the etchant precursor. The methods may include removing the tungsten oxy-fluoride material.

In some embodiments, the halogen-containing precursor may be or include fluorine. The etchant precursor may be or include a chlorine-containing precursor. The halogen-containing precursor may be or include nitrogen trifluoride. The methods may include flowing hydrogen with the halogen-containing precursor. A flow rate of the hydrogen may be at least twice a flow rate of the halogen-containing precursor. The semiconductor processing chamber may be maintained plasma-free during the flowing of the etchant precursor. The etching method may be performed at a temperature greater than or about 150° C. A pressure in the semiconductor processing chamber may be maintained below or about 15 Torr while flowing the halogen-containing precursor. A pressure in the semiconductor processing chamber may be maintained above or about 15 Torr while flowing the etchant precursor. The substrate may include an exposed region of silicon oxide. A trench may be formed through the silicon oxide to define the exposed region of tungsten oxide.

Some embodiments of the present technology may encompass etching methods. The methods may include forming a plasma of a first halogen-containing precursor to produce plasma effluents in a remote plasma region of a semiconductor processing chamber. The methods may include flowing the plasma effluents into a processing region of the semiconductor processing chamber. The methods may include contacting a substrate housed in the processing region with the plasma effluents. the substrate may include an exposed region of tungsten oxide overlying a region of tungsten at a base of a trench defined in the substrate. The plasma effluents may halogenate the tungsten oxide. The methods may include flowing a second halogen- containing precursor into the processing region of the semiconductor processing chamber. The methods may include removing the halogenated tungsten oxide.

In some embodiments, the first halogen-containing precursor may be or include fluorine. The second halogen-containing precursor may be or include boron trichloride. The methods may include halting plasma formation prior to flowing the second halogen-containing precursor. The first halogen-containing precursor may be or include nitrogen trifluoride. The methods may include flowing hydrogen with the first halogen-containing precursor. A flow rate of the hydrogen may be at least twice a flow rate of the first halogen-containing precursor. A pressure in the semiconductor processing chamber may be maintained below or about 15 Torr while flowing the first halogen-containing precursor. A pressure in the semiconductor processing chamber may be maintained above or about 15 Torr while flowing the second halogen-containing precursor.

Some embodiments of the present technology may encompass etching methods. The methods may include forming a plasma of a fluorine-containing precursor to produce plasma effluents in a remote plasma region of a semiconductor processing chamber. The methods may include flowing the plasma effluents into a processing region of the semiconductor processing chamber. The methods may include contacting a substrate housed in the processing region with the plasma effluents. The substrate may include an exposed region of tungsten oxide overlying a region of tungsten. The plasma effluents may fluorinate the tungsten oxide. The methods may include flowing a chlorine-containing precursor into the processing region of the semiconductor processing chamber. The methods may include contacting the substrate with the chlorine-containing precursor. The methods may include removing the tungsten oxide.

In some embodiments, the methods may include flowing hydrogen with the fluorine-containing precursor. A flow rate of the hydrogen may be at least twice a flow rate of the fluorine-containing precursor. A pressure in the semiconductor processing chamber may be maintained below or about 10 Torr while flowing the fluorine-containing precursor. A pressure in the semiconductor processing chamber may be maintained above or about 20 Torr while flowing the chlorine-containing precursor.

Such technology may provide numerous benefits over conventional systems and techniques. For example, the processes may allow dry etching to be performed that may protect features of the substrate. Additionally, the processes may selectively remove tungsten-containing films relative to other exposed materials on the substrate. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
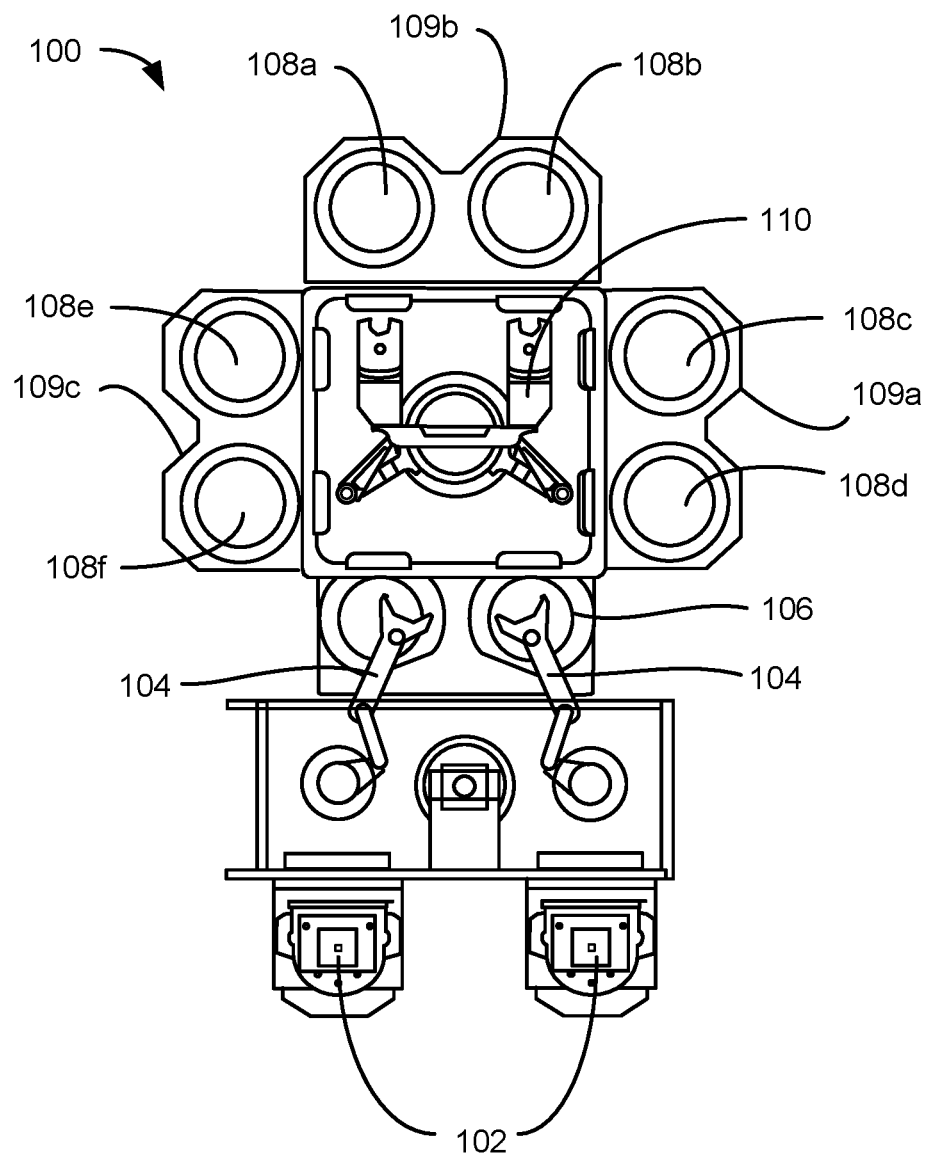
FIG. 1 shows a top plan view of one embodiment of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include additional or exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

As 3D NAND structures grow in the number of cells being formed, the aspect ratios of memory holes, contact openings, and other structures increase, sometimes dramatically. During 3D NAND processing, stacks of placeholder layers and dielectric materials may form the inter-electrode dielectric or inter-poly dielectric ("IPD") layers. These placeholder layers may have a variety of operations performed to place structures before fully removing the material and replacing it with metal. The IPD layers are often formed overlying a conductor layer, such as polysilicon, for example. When the memory holes are formed, apertures may extend through all of the alternating layers of material before accessing the polysilicon or other material substrate. Subsequent processing may form a staircase structure for contacts, and may also exhume the placeholder materials laterally.

A reactive-ion etching ("RIE") operation may be performed to produce the high aspect ratio memory holes. The RIE process often involves a combination chemical and physical removal of the alternating layers, which may form a carbon polymer layer over sidewalls during etching, and which may protect layers from further etching. After forming memory structures, additional RIE processes may be performed to form contact openings through a layer of dielectric material, which may be performed to produce multi-level contacts, for example. The process may etch down through the dielectric to expose a contact landing or pad, which may be metal. During a subsequent ashing process, which may remove the carbon polymer layer, or during a subsequent mask removal, the exposed metal may be at least partially oxidized along the contact surface. As this contact may be an electrical contact for the memory structures, the oxidized interface may increase resistance at the landing, which may detrimentally impact device performance.

Conventional technologies have often accepted these oxidation regions because additional removal may create additional damage. For example, an additional RIE etch to remove the oxide may damage underlying metal on the contact landing due to the ion bombardment from the RIE process. Additional etching may also etch the dielectric through which the contact openings are formed, and which may impact aspect ratios by increasing critical dimensions of the openings. The present technology overcomes these limitations by performing a selective etch process to remove the metal oxide material. The etch process may be selective to both the dielectric material through which the openings are formed, and may also be selective to the underlying metal. By performing a chemical removal of the oxide material with the etch process, metal sputtering may also be limited or prevented.

Although the remaining disclosure will routinely identify specific materials and semiconductor structures utilizing the disclosed technology, it will be readily understood that the systems, methods, and materials are equally applicable to a number of other structures that may benefit from aspects of the present technology. Accordingly, the technology should not be considered to be so limited as for use with 3D NAND processes or materials alone. Moreover, although an exemplary chamber is described to provide foundation for the present technology, it is to be understood that the present technology can be applied to virtually any semiconductor processing chamber that may allow the operations described.

FIG. 1 shows a top plan view of one embodiment of a processing system 100 of deposition, etching, baking, and curing chambers according to embodiments. In the figure, a pair of front opening unified pods 102 supply substrates of a variety of sizes that are received by robotic arms 104 and placed into a low pressure holding area 106 before being placed into one of the substrate processing chambers 108a-f, positioned in tandem sections 109a-c. A second robotic arm 110 may be used to transport the substrate wafers from the holding area 106 to the substrate processing chambers 108a-f and back. Each substrate processing chamber 108a-f, can be outfitted to perform a number of substrate processing operations including the dry etch processes described herein in addition to cyclical layer deposition, atomic layer deposition, chemical vapor deposition, physical vapor deposition, etch, pre-clean, degas, orientation, and other substrate processes.

The substrate processing chambers 108a-f may include one or more system components for depositing, annealing, curing and/or etching a dielectric film on the substrate wafer. In one configuration, two pairs of the processing chambers, e.g., 108c-d and 108e-f, may be used to deposit dielectric material on the substrate, and the third pair of processing chambers, e.g., 108*a-b*, may be used to etch the deposited dielectric. In another configuration, all three pairs of chambers, e.g., 108*a-f*, may be configured to etch a dielectric film on the substrate. Any one or more of the processes described may be carried out in chamber(s) separated from the fabrication system shown in different embodiments. It will be appreciated that additional configurations of deposition, etching, annealing, and curing chambers for dielectric films are contemplated by system 100.

Figure 2A:
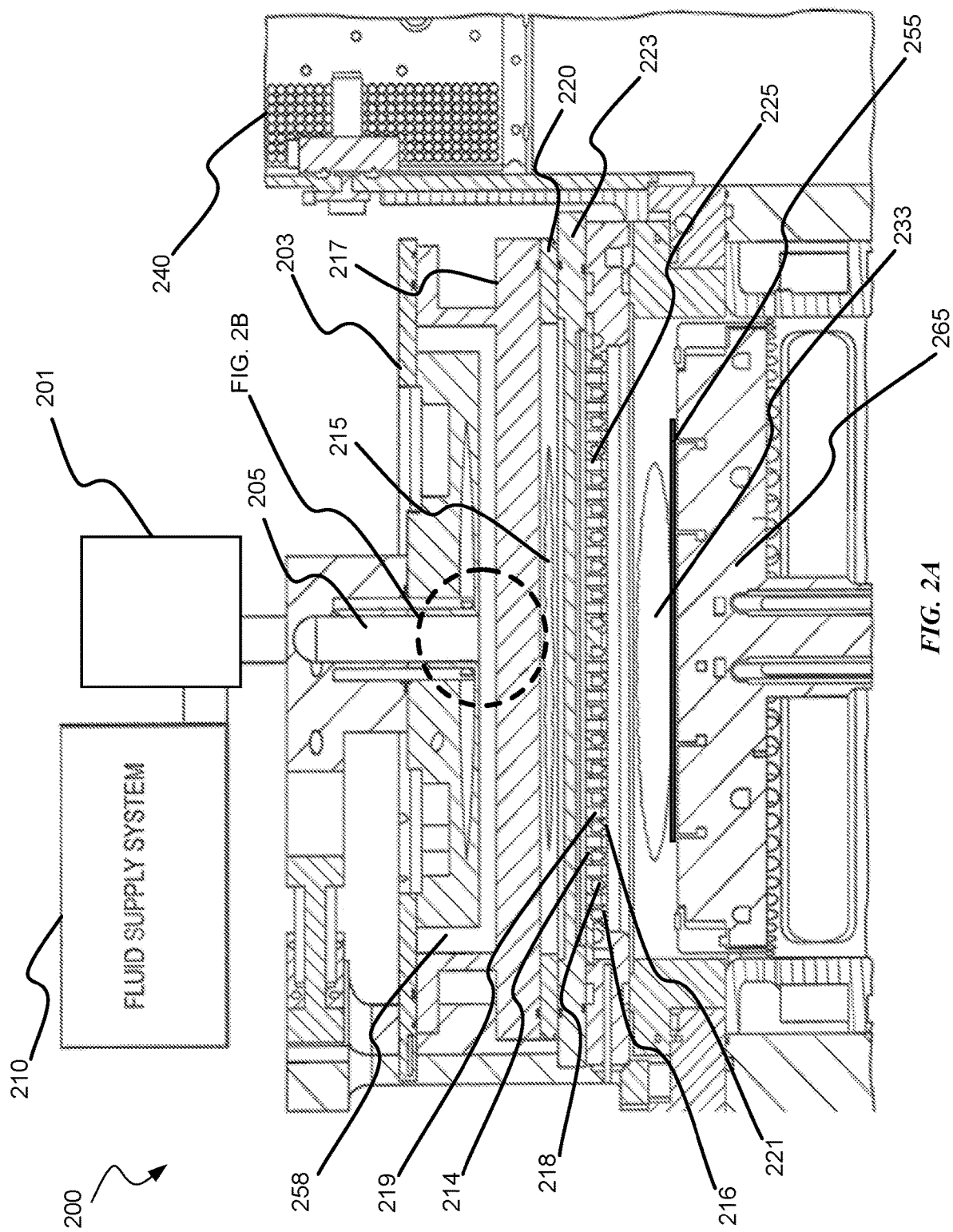
FIG. 2A shows a schematic cross-sectional view of an exemplary processing chamber according to some embodiments of the present technology.

FIG. 2A shows a cross-sectional view of an exemplary process chamber system 200 with partitioned plasma generation regions within the processing chamber. During film etching, e.g., titanium nitride, tantalum nitride, tungsten, silicon, polysilicon, silicon oxide, silicon nitride, silicon oxynitride, silicon oxycarbide, etc., a process gas may be flowed into the first plasma region 215 through a gas inlet assembly 205. A remote plasma system 201 may optionally be included in the system, and may process a first gas which then travels through gas inlet assembly 205. The inlet assembly 205 may include two or more distinct gas supply channels where the second channel (not shown) may bypass the RPS 201, if included.

A cooling plate 203, faceplate 217, ion suppressor 223, showerhead 225, and a pedestal 265 or substrate support, having a substrate 255 disposed thereon, are shown and may each be included according to embodiments. The pedestal 265 may have a heat exchange channel through which a heat exchange fluid flows to control the temperature of the substrate, which may be operated to heat and/or cool the substrate or wafer during processing operations. The wafer support platter of the pedestal 265, which may include aluminum, ceramic, or a combination thereof, may also be resistively heated in order to achieve relatively high temperatures, such as from up to or about 100° C. to above or about 1100° C., using an embedded resistive heater element.

The faceplate 217 may be pyramidal, conical, or of another similar structure with a narrow top portion expanding to a wide bottom portion. The faceplate 217 may additionally be flat as shown and include a plurality of through-channels used to distribute process gases. Plasma generating gases and/or plasma excited species, depending on use of the RPS 201, may pass through a plurality of holes, shown in FIG. 2B, in faceplate 217 for a more uniform delivery into the first plasma region 215.

Exemplary configurations may include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The faceplate 217, or a conductive top portion of the chamber, and showerhead 225 are shown with an insulating ring 220 located between the features, which allows an AC potential to be applied to the faceplate 217 relative to showerhead 225 and/or ion suppressor 223. The insulating ring 220 may be positioned between the faceplate 217 and the showerhead 225 and/or ion suppressor 223 enabling a capacitively-coupled plasma to be formed in the first plasma region. A baffle (not shown) may additionally be located in the first plasma region 215, or otherwise coupled with gas inlet assembly 205, to affect the flow of fluid into the region through gas inlet assembly 205.

The ion suppressor 223 may comprise a plate or other geometry that defines a plurality of apertures throughout the structure that are configured to suppress the migration of ionically-charged species out of the first plasma region 215 while allowing uncharged neutral or radical species to pass through the ion suppressor 223 into an activated gas delivery region between the suppressor and the showerhead. In embodiments, the ion suppressor 223 may comprise a perforated plate with a variety of aperture configurations. These uncharged species may include highly reactive species that are transported with less reactive carrier gas through the apertures.

As noted above, the migration of ionic species through the holes may be reduced, and in some instances completely suppressed. Controlling the amount of ionic species passing through the ion suppressor 223 may advantageously provide increased control over the gas mixture brought into contact with the underlying wafer substrate, which in turn may increase control of the deposition and/or etch characteristics of the gas mixture. For example, adjustments in the ion concentration of the gas mixture can significantly alter its etch selectivity, e.g., SiNx:SiOx etch ratios, Si:SiOx etch ratios, etc. In alternative embodiments in which deposition is performed, it can also shift the balance of conformal-to-flowable style depositions for dielectric materials.

The plurality of apertures in the ion suppressor 223 may be configured to control the passage of the activated gas, i.e., the ionic, radical, and/or neutral species, through the ion suppressor 223. For example, the aspect ratio of the holes, or the hole diameter to length, and/or the geometry of the holes may be controlled so that the flow of ionically-charged species in the activated gas passing through the ion suppressor 223 is reduced. The holes in the ion suppressor 223 may include a tapered portion that faces the plasma excitation region 215, and a cylindrical portion that faces the showerhead 225. The cylindrical portion may be shaped and dimensioned to control the flow of ionic species passing to the showerhead 225. An adjustable electrical bias may also be applied to the ion suppressor 223 as an additional means to control the flow of ionic species through the suppressor.

The ion suppressor 223 may function to reduce or eliminate the amount of ionically charged species traveling from the plasma generation region to the substrate. Uncharged neutral and radical species may still pass through the openings in the ion suppressor to react with the substrate. It should be noted that the complete elimination of ionically charged species in the reaction region surrounding the substrate may not be performed in embodiments. In certain instances, ionic species are intended to reach the substrate in order to perform the etch and/or deposition process. In these instances, the ion suppressor may help to control the concentration of ionic species in the reaction region at a level that assists the process.

Showerhead 225 in combination with ion suppressor 223 may allow a plasma present in first plasma region 215 to avoid directly exciting gases in substrate processing region 233, while still allowing excited species to travel from chamber plasma region 215 into substrate processing region 233. In this way, the chamber may be configured to prevent the plasma from contacting a substrate 255 being etched. This may advantageously protect a variety of intricate structures and films patterned on the substrate, which may be damaged, dislocated, or otherwise warped if directly contacted by a generated plasma. Additionally, when plasma is allowed to contact the substrate or approach the substrate level, the rate at which oxide species etch may increase. Accordingly, if an exposed region of material is oxide, this material may be further protected by maintaining the plasma remotely from the substrate.

The processing system may further include a power supply 240 electrically coupled with the processing chamber to provide electric power to the faceplate 217, ion suppressor 223, showerhead 225, and/or pedestal 265 to generate a plasma in the first plasma region 215 or processing region 233. The power supply may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma region 215. This in turn may allow development of particular plasma characteristics such that precursors may be dissociated in specific ways to enhance the etching profiles produced by these precursors.

A plasma may be ignited either in chamber plasma region 215 above showerhead 225 or substrate processing region 233 below showerhead 225. Plasma may be present in chamber plasma region 215 to produce the radical precursors from an inflow of, for example, a fluorine-containing precursor or other precursor. An AC voltage typically in the radio frequency ("RF") range may be applied between the conductive top portion of the processing chamber, such as faceplate 217, and showerhead 225 and/or ion suppressor 223 to ignite a plasma in chamber plasma region 215 during deposition. An RF power supply may generate a high RF frequency of 13.56 MHz but may also generate other frequencies alone or in combination with the 13.56 MHz frequency.

Figure 2B:
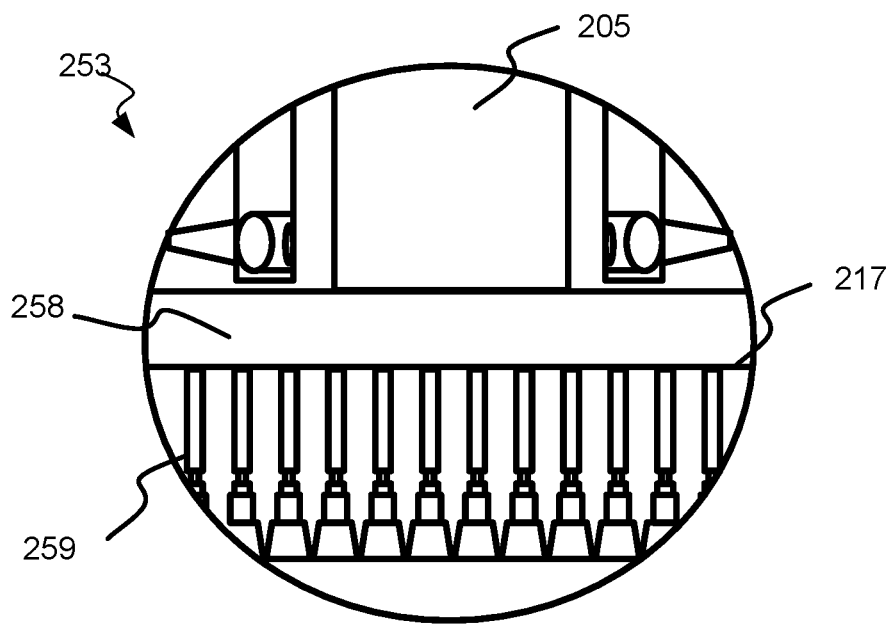
FIG. 2B shows a detailed view of a portion of the processing chamber illustrated in FIG. 2A according to some embodiments of the present technology.

FIG. 2B shows a detailed view 253 of the features affecting the processing gas distribution through faceplate 217. As shown in FIGS. 2A and 2B, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

Figure 3:
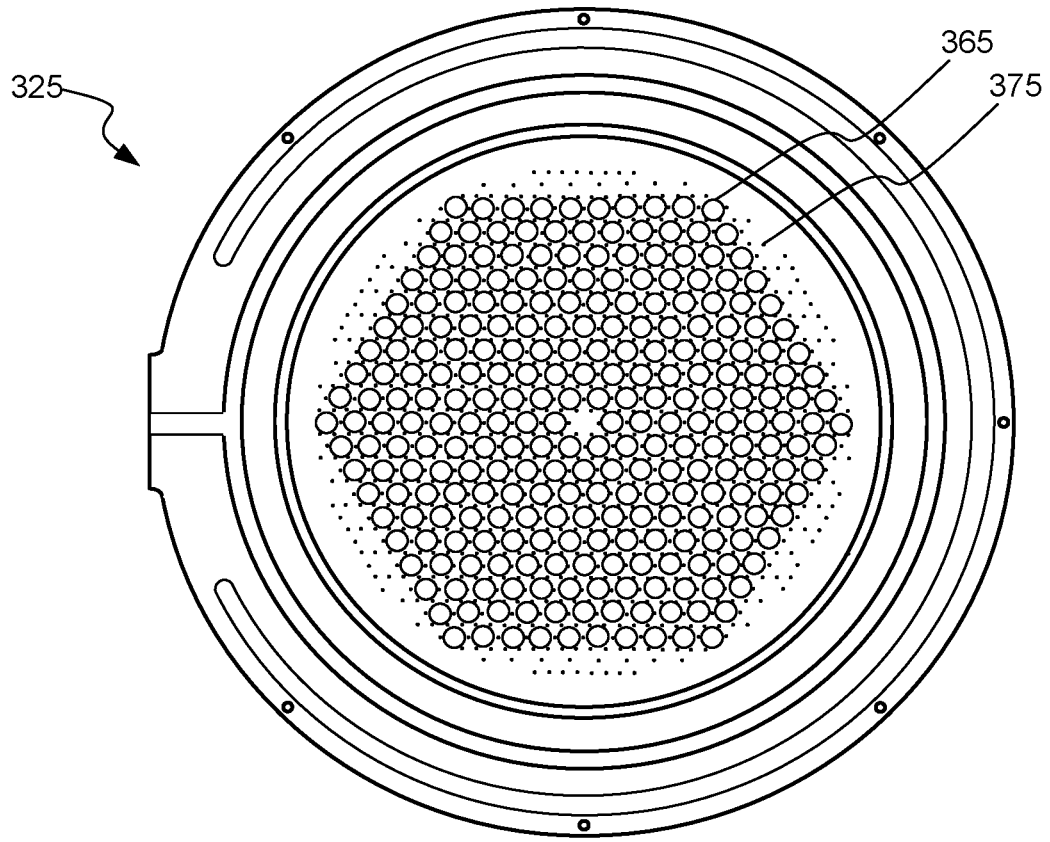
FIG. 3 shows a bottom plan view of an exemplary showerhead according to some embodiments of the present technology.

The gas distribution assemblies such as showerhead 225 for use in the processing chamber section 200 may be referred to as dual channel showerheads and are additionally detailed in the embodiments described in FIG. 3. The dual channel showerhead may provide for etching processes that allow for separation of etchants outside of the processing region 233 to provide limited interaction with chamber components and each other prior to being delivered into the processing region.

The showerhead 225 may comprise an upper plate 214 and a lower plate 216. The plates may be coupled with one another to define a volume 218 between the plates. The coupling of the plates may be so as to provide first fluid channels 219 through the upper and lower plates, and second fluid channels 221 through the lower plate 216. The formed channels may be configured to provide fluid access from the volume 218 through the lower plate 216 via second fluid channels 221 alone, and the first fluid channels 219 may be fluidly isolated from the volume 218 between the plates and the second fluid channels 221. The volume 218 may be fluidly accessible through a side of the showerhead 225.

FIG. 3 is a bottom view of a showerhead 325 for use with a processing chamber according to embodiments. Showerhead 325 may correspond with the showerhead 225 shown in FIG. 2A. Through-holes 365, which show a view of first fluid channels 219, may have a plurality of shapes and configurations in order to control and affect the flow of precursors through the showerhead 225. Small holes 375, which show a view of second fluid channels 221, may be distributed substantially evenly over the surface of the showerhead, even amongst the through-holes 365, and may help to provide more even mixing of the precursors as they exit the showerhead than other configurations.

Figure 4:
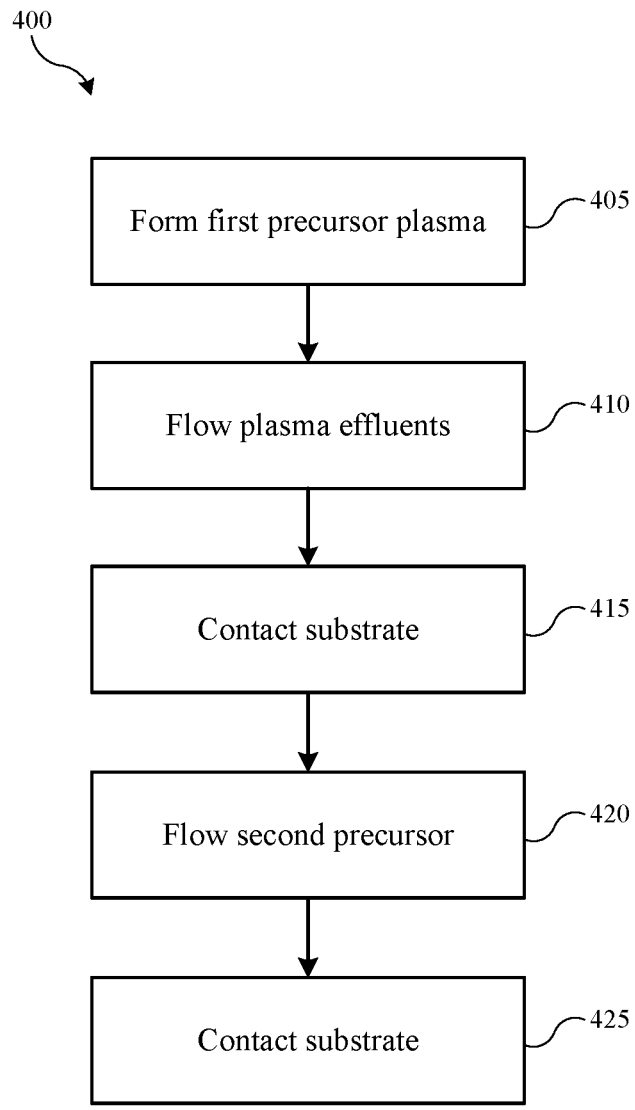
FIG. 4 shows exemplary operations in a method according to some embodiments of the present technology.

The chamber discussed previously may be used in performing exemplary methods including etching methods. Turning to FIG. 4 is shown exemplary operations in a method 400 according to embodiments of the present technology. Method 400 may include one or more operations prior to the initiation of the method, including front end processing, deposition, etching, polishing, cleaning, or any other operations that may be performed prior to the described operations. The method may include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 400 may describe operations shown schematically in FIGS. 5A-5B, the illustrations of which will be described in conjunction with the operations of method 400. It is to be understood that the figures illustrate only partial schematic views, and a substrate may contain any number of additional materials and features having a variety of characteristics and aspects as illustrated in the figures.

Figure 5A:
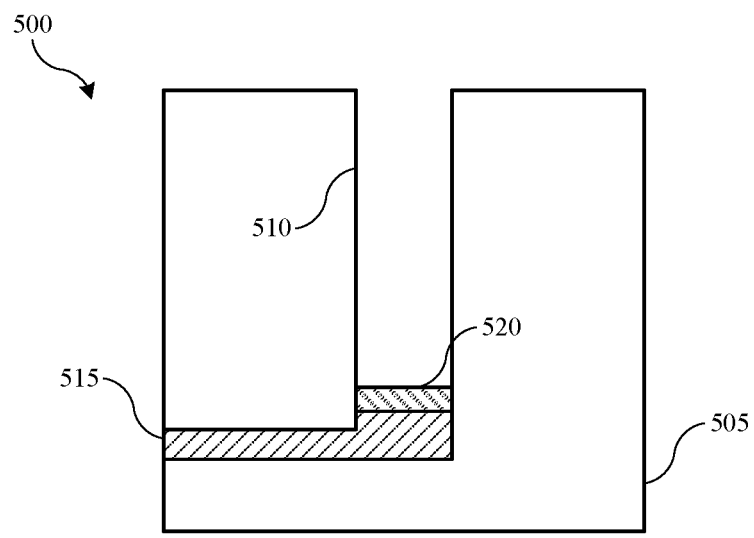
FIGS. 5A-5B show schematic cross-sectional views of materials etched according to some embodiments of the present technology.

Method 400 may or may not involve optional operations to develop the semiconductor structure to a particular fabrication operation. It is to be understood that method 400 may be performed on any number of semiconductor structures or substrates 505, as illustrated in FIG. 5A, including exemplary structures on which an oxide removal operation may be performed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include metal materials, one or more dielectric materials, a contact material, a transistor material, or any other material that may be used in semiconductor processes.

For example, FIG. 5A may illustrate a contact region of a 3D NAND structure, laterally offset from memory cell sections. Substrate 505 may illustrate a dielectric material overlying one or more other structures on a substrate, and it is to be understood that any number of materials may be formed beneath the structure illustrated. In some embodiments dielectric materials may be or include silicon oxide, or any other oxide or nitride through which patterning may occur. A contact opening 510 may be defined through the substrate 505, and may have been formed by a reactive-ion etch or other patterning process in some embodiments. Although only a single opening 510 is shown, it is to be understood that any number of openings may be formed, such as to produce a contact staircase structure or other contact pattern through the dielectric. The openings may be formed to the level of extensions of metal or conductive material 515, which may be extensions of the memory word lines forming the staircase structure by which cell electrical contacts may be formed. The conductive material 515 may be any number of metal or conductive materials, and may be tungsten, cobalt, copper, or any other material for conductive coupling. As explained previously, due to one or more previous operations, an amount of oxide 520 may be formed overlying the landing of conductive material 515. If left on the conductive material, subsequent contact metal deposition may produce increased resistance between the contact metal and the word line extensions, which may impact device performance.

It is to be understood that the noted structure is not intended to be limiting, and any of a variety of other semiconductor structures including tungsten-containing materials or other metal-containing materials are similarly encompassed. Other exemplary structures may include two-dimensional and three-dimensional structures common in semiconductor manufacturing, and within which a tungsten-containing material such as tungsten oxide is to be removed relative to one or more other materials, as the present technology may selectively remove tungsten-containing materials relative to other exposed materials, such as silicon-containing materials, and any of the other materials discussed elsewhere. Additionally, although a high-aspect-ratio structure may benefit from the present technology, the technology may be equally applicable to lower aspect ratios and any other structures.

For example, layers of material according to the present technology may be characterized by any aspect ratios or the height-to-width ratio of the structure, although in some embodiments the materials may be characterized by larger aspect ratios, which may not allow sufficient etching utilizing conventional technology or methodology. For example, in some embodiments the aspect ratio of any layer of an exemplary structure may be greater than or about 10:1, greater than or about 20:1, greater than or about 30:1, greater than or about 40:1, greater than or about 50:1, or greater. Additionally, each layer may be characterized by a reduced width or thickness less than or about 100 nm, less than or about 80 nm, less than or about 60 nm, less than or about 50 nm, less than or about 40 nm, less than or about 30 nm, less than or about 20 nm, less than or about 10 nm, less than or about 5 nm, less than or about 1 nm, or less, including any fraction of any of the stated numbers, such as 20.5 nm, 1.5 nm, etc. This combination of high aspect ratios and minimal thicknesses may frustrate many conventional etching operations, or require substantially longer etch times to remove a layer, along a vertical or horizontal distance through a confined width. Moreover, damage to or removal of other exposed layers may occur with conventional technologies as previously explained.

Method 400 may be performed to remove an exposed tungsten-containing material in embodiments, although any number of oxide or tungsten-containing materials may be removed in any number of structures in embodiments of the present technology. The methods may include specific operations for the removal of tungsten oxide. Although the remaining disclosure will routinely discuss tungsten oxide, it is to be understood that other metal oxides may similarly be processed by some embodiments of the present technology. In some embodiments, the methods may include a multiple-operation etch process, which may control etching of the tungsten relative to other exposed materials, such as the dielectric material, for example silicon oxide, and the underlying contact material, such as tungsten or some other conductive material used in the structure.

Method 400 may include flowing a halogen-containing precursor, including a first halogen-containing precursor, into a semiconductor processing chamber housing the described substrate, or some other substrate, at operation 405. The halogen-containing precursor may be flowed through a remote plasma region of the processing chamber, such as region 215 described above, and a plasma may be formed of the halogen-containing precursor to produce plasma effluents. Although a substrate-level plasma may be produced, in some embodiments the plasma may be a remote plasma, which may protect exposed substrate materials from ion bombardment that may occur due to the substrate-level plasma. At operation 410, the plasma effluents of the halogen-containing precursor may be delivered to the substrate processing region, where the effluents may contact the semiconductor substrate including an exposed tungsten-containing material at operation 415. The contacting may produce a fluorinated material, such as tungsten oxy-fluoride or a tungsten oxide halide material, such as by converting the exposed tungsten oxide on the substrate. In some embodiments, subsequent the fluorination, the plasma may be extinguished, and the chamber may be purged.

Figure 5B:
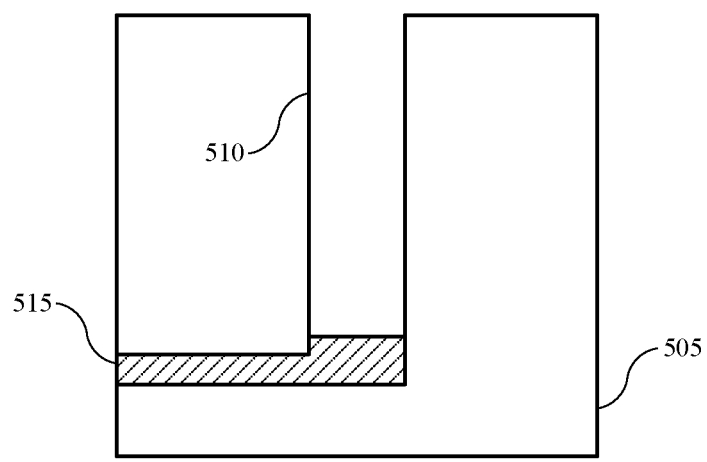

Subsequent the fluorination operation, an etchant precursor may be flowed into the processing region at operation 420. In some embodiments, the etchant precursor may be a second halogen-containing precursor, and may include the same or a different halogen as the first halogen-containing precursor. The etchant precursor may interact with the tungsten oxide or other oxide material to produce tungsten and/or oxygen byproducts that may be volatile under processing conditions, and may be evolved from the substrate. Accordingly, the etchant precursor may contact the fluorinated material at operation 425, which may etch or remove the tungsten oxide material from the underlying metal. As illustrated in FIG. 5B, removal of the oxide material may expose a contact surface of contact material at the bottom of the aperture or trench formed.

In some embodiments the second precursor may not be plasma enhanced, and in some embodiments the semiconductor processing chamber may be maintained plasma-free during delivery and operations utilizing the second halogen precursor. By utilizing particular precursors, and performing the etching within certain process conditions, a plasma-free removal may be performed, and the removal may also be a dry etch. Accordingly, techniques according to aspects of the present technology may be performed to remove tungsten oxide from narrow features, as well as high aspect ratio features, and thin dimensions that may otherwise be unsuitable for wet etching or reactive ion etching.

The precursors during each of the two-step operation may include halogen-containing precursors, and may include one or more of fluorine or chlorine in some embodiments. Some exemplary precursors that may be utilized as the first precursor may include halides including hydrogen fluoride, nitrogen trifluoride, or any organofluoride. The precursors may also be flown together in a variety of combinations. In some embodiments, nitrogen trifluoride, or some other fluorine-containing precursor may be delivered to a remote plasma region with hydrogen and plasma enhanced to produce a fluorinated surface of tungsten oxide in the first operation.

Etchant precursors utilized as the second halogen precursor may be or include chlorine-containing precursors, such as including boron trichloride, or any other chlorine materials. At processing conditions of the present technology, boron trichloride may facilitate formation of volatile byproducts that may remove the fluorinated tungsten oxide. For example, some byproducts may include tungsten oxychloride or tungsten pentachloride, which may be volatile at processing temperatures, facilitating removal of the material from the substrate.

Processing conditions may impact and facilitate etching according to the present technology. Because the etch reaction may proceed based on thermal dissociation of halogen for the second reaction between the second halogen precursor and the fluorinated oxide material, the temperatures may be at least partially dependent on the particular halogen or the precursor in order to initiate dissociation. For example, as temperature increases above or about 100° C. or above or about 150° C., etching may begin to occur or increase, which may indicate dissociation of the precursor, and/or activation of the reaction with tungsten oxy-fluoride. As temperature continues to increase, dissociation may be further facilitated as may the reaction with fluorinated tungsten oxide.

Accordingly, in some embodiments of the present technology, etching methods may be performed at substrate, pedestal, and/or chamber temperatures above or about 100° C., and may be performed at temperatures above or about 150° C., above or about 200° C., above or about 250° C., above or about 300° C., above or about 350° C., above or about 400° C., above or about 450° C., or higher. The temperature may also be maintained at any temperature within these ranges, within smaller ranges encompassed by these ranges, or between any of these ranges. In some embodiments the method may be performed on substrates that may have a number of produced features, which may produce a thermal budget. Accordingly, in some embodiments, the methods may be performed at temperatures below or about 800° C., and may be performed at temperatures below or about 750° C., below or about 700° C., below or about 650° C., below or about 600° C., below or about 550° C., below or about 500° C., or lower.

The pressure within the chamber may also affect the operations performed as well as affect at what temperature the halogen may dissociate from the transition metal. To facilitate the fluorination, which may be based on plasma-enhanced precursors, a processing pressure may be lower than in the second removal operation. By maintaining a lower pressure in the first operation, such as during use of the first halogen precursor, increased interaction at the substrate surface may be facilitated. The lower pressure in the first portion of the method may increase the mean-free path between atoms, which may increase energy and interaction at the film surface. By utilizing a higher pressure in the second portion of the method, such as during use of the second halogen precursor, etch rate may be increased. Accordingly, in some embodiments the pressure may be maintained below about 20 Torr during the first portion of the etch, such as during operations 405-415, and the pressure may be maintained below or about 15 Torr, below or about 10 Torr, below or about 9 Torr, below or about 8 Torr, below or about 7 Torr, below or about 6 Torr, below or about 5 Torr, below or about 4 Torr, below or about 3 Torr, below or about 2 Torr, below or about 1 Torr, below or about 0.5 Torr, or less. The pressure may then be increased during the second portion of the method, such as during operations 420-425, where the pressure may be maintained at a pressure of greater than or about 1 Torr, and may be maintained at greater than or about 5 Torr, greater than or about 10 Torr, greater than or about 15 Torr, greater than or about 20 Torr, greater than or about 25 Torr, greater than or about 30 Torr, greater than or about 35 Torr, greater than or about 40 Torr, greater than or about 45 Torr, greater than or about 50 Torr, greater than or about 75 Torr, greater than or about 100 Torr, or higher, which may extend up to atmospheric pressure, although vacuum conditions may facilitate operations in some embodiments. The pressure may also be maintained at any pressure within these ranges, within smaller ranges encompassed by these ranges, or between any of these ranges.

As noted previously, in some embodiments hydrogen may be delivered with the nitrogen trifluoride, or the first halogen precursor. By including hydrogen, etch rates of materials from fluorine may be reduced or suppressed during fluorination. To protect the dielectric material through which the aperture or trench may be formed, as well as to protect the metal underlying the oxide material, hydrogen may be delivered at a flow rate greater than the flow rate of the first halogen-containing precursor. For example, in some embodiments in which the first halogen-containing precursor may be nitrogen trifluoride, a flow rate ratio of hydrogen to nitrogen trifluoride may be greater than or about 1.5:1, and a flow rate ratio of hydrogen to nitrogen trifluoride may be greater than or about 2.0:1, greater than or about 2.5:1, greater than or about 3.0:1, greater than or about 3.5:1, greater than or about 4.0:1, greater than or about 4.5:1, greater than or about 5.0:1, greater than or about 10.0:1, or higher. The hydrogen radicals may help passivate other exposed materials while fluorine interacts with the oxide material at the base of the trench or feature.

Adding further control to the etch process, the halogen-containing precursor may be pulsed in some embodiments, and may be delivered throughout the etch process either continually or in a series of pulses, which may be consistent or varying over time. The pulsed delivery may be characterized by a first period of time during which the halogen-containing precursor is flowed, and a second period of time during which the halogen-containing precursor is paused or halted. The time periods for any pulsing operation may be similar or different from one another with either time period being longer. In embodiments either period of time or a continuous flow of precursor may be performed for a time period greater than or about 1 second, and may be greater than or about 2 seconds, greater than or about 3 seconds, greater than or about 4 seconds, greater than or about 5 seconds, greater than or about 6 seconds, greater than or about 7 seconds, greater than or about 8 seconds, greater than or about 9 seconds, greater than or about 10 seconds, greater than or about 11 seconds, greater than or about 12 seconds, greater than or about 13 seconds, greater than or about 14 seconds, greater than or about 15 seconds, greater than or about 20 seconds, greater than or about 30 seconds, greater than or about 45 seconds, greater than or about 60 seconds, or longer. The times may also be any smaller range encompassed by any of these ranges. In some embodiments as delivery of the precursor occurs for longer periods of time, etch rate may increase.

By performing operations according to embodiments of the present technology, tungsten oxide or other oxide materials may be etched selectively relative to other materials, including other oxides. For example, the present technology may selectively etch tungsten oxide relative to exposed regions of metals, dielectrics including silicon-containing materials including silicon oxide, or other materials. Embodiments of the present technology may etch tungsten oxide or other metal oxides relative to silicon oxide, silicon nitride, tungsten, or any of the other materials at a rate of at least about 100:1, and may etch tungsten oxide relative to silicon oxide, silicon nitride, tungsten, or any of the other materials noted previously at a selectivity greater than or about 200:1, greater than or about 300:1, greater than or about 400:1, greater than or about 500:1, greater than or about 1,000:1, or more. For example, etching performed according to some embodiments of the present technology may etch tungsten oxide while substantially or essentially maintaining silicon oxide, silicon nitride, tungsten, or other materials.

The previously discussed methods may allow the removal of tungsten oxide or other oxide materials relative to a number of other exposed materials. By utilizing multi-precursor etchant processes as described previously, improved etching of tungsten oxide may be performed, which may both increase selectivity over conventional techniques, as well as improve etching access in small pitch features.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology. Additionally, methods or processes may be described as sequential or in steps, but it is to be understood that the operations may be performed concurrently, or in different orders than listed.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s) ", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. An etching method comprising:
   flowing a halogen-containing precursor into a remote plasma region of a semiconductor processing chamber while striking a plasma to produce plasma effluents;
   contacting a substrate housed in a processing region with the plasma effluents, wherein the substrate defines an exposed region of tungsten oxide, and wherein the contacting produces a tungsten oxy-fluoride material;
   increasing a pressure in the semiconductor processing chamber;
   flowing an etchant precursor into the processing region;
   contacting the tungsten oxy-fluoride material with the etchant precursor; and
   removing the tungsten oxy-fluoride material.

2. The etching method of claim 1, wherein the halogen-containing precursor comprises fluorine, and wherein the etchant precursor comprises a chlorine-containing precursor.

3. The etching method of claim 2, wherein the halogen-containing precursor comprises nitrogen trifluoride, the method further comprising:
   flowing hydrogen with the halogen-containing precursor.

4. The etching method of claim 3, wherein a flow rate of the hydrogen is at least twice a flow rate of the halogen-containing precursor.

5. The etching method of claim 1, wherein the semiconductor processing chamber is maintained plasma-free during the flowing of the etchant precursor.

6. The etching method of claim 1, wherein the etching method is performed at a temperature greater than or about 150° C.

7. The etching method of claim 1, wherein a pressure in the semiconductor processing chamber is maintained below 15 Torr while flowing the halogen-containing precursor.

8. The etching method of claim 7, wherein a pressure in the semiconductor processing chamber is maintained above 15 Torr while flowing the etchant precursor.

9. The etching method claim 1, wherein the substrate may further comprise an exposed region of silicon oxide.

10. The etching method claim 9, wherein a trench is formed through the silicon oxide to define the exposed region of tungsten oxide.

11. An etching method comprising:
    forming a plasma of a first halogen-containing precursor to produce plasma effluents in a remote plasma region of a semiconductor processing chamber;
    flowing the plasma effluents into a processing region of the semiconductor processing chamber at a first pressure;
    contacting a substrate housed in the processing region with the plasma effluents, wherein the substrate comprises an exposed region of tungsten oxide overlying a region of tungsten at a base of a trench defined in the substrate, and wherein the plasma effluents halogenate the tungsten oxide;
    flowing a second halogen-containing precursor into the processing region of the semiconductor processing chamber at a second pressure, wherein the second pressure is greater than the first pressure; and
    removing the halogenated tungsten oxide.

12. The etching method of claim 11, wherein the first halogen- containing precursor comprises fluorine, and wherein the second halogen-containing precursor comprises boron trichloride.

13. The etching method of claim 11, further comprising halting plasma formation prior to flowing the second halogen-containing precursor.

14. The etching method of claim 11, wherein the first halogen- containing precursor comprises nitrogen trifluoride, the method further comprising:
    flowing hydrogen with the first halogen-containing precursor.

15. The etching method of claim 14, wherein a flow rate of the hydrogen is at least twice a flow rate of the first halogen-containing precursor.

16. The etching method of claim 11, wherein a pressure in the semiconductor processing chamber is maintained below 15 Torr while flowing the first halogen-containing precursor.

17. The etching method of claim 16, wherein a pressure in the semiconductor processing chamber is maintained above 15 Torr while flowing the second halogen-containing precursor.

18. An etching method comprising:
   forming a plasma of a fluorine-containing precursor to produce plasma effluents in a remote plasma region of a semiconductor processing chamber;
   flowing the plasma effluents into a processing region of the semiconductor processing chamber;
   contacting a substrate housed in the processing region with the plasma effluents, wherein the substrate comprises an exposed region of tungsten oxide overlying a region of tungsten, and wherein the plasma effluents fluorinate the tungsten oxide;
   increasing a pressure within the semiconductor processing chamber subsequent to contacting the substrate with the plasma effluents;
   flowing a chlorine-containing precursor into the processing region of the semiconductor processing chamber;
   contacting the substrate with the chlorine-containing precursor; and
   removing the tungsten oxide.

19. The etching method of claim 18, further comprising:
   flowing hydrogen with the fluorine-containing precursor, wherein a flow rate of the hydrogen is at least twice a flow rate of the fluorine-containing precursor.

20. The etching method of claim 18, wherein a pressure in the semiconductor processing chamber is maintained below or about 10 Torr while flowing the fluorine-containing precursor, and wherein a pressure in the semiconductor processing chamber is maintained above or about 20 Torr while flowing the chlorine-containing precursor.

* * * * *